(12) United States Patent
Nogami

(10) Patent No.: US 8,105,440 B2
(45) Date of Patent: *Jan. 31, 2012

(54) METHOD OF CLEANING A CVD DEVICE

(75) Inventor: Hiroshi Nogami, Tama (JP)

(73) Assignee: Canon Anelva Corporation, Kawasaki-Shi, Kanagawa (JP)

( * ) Notice: Subject to any disclaimer, the term of this patent is extended or adjusted under 35 U.S.C. 154(b) by 98 days.

This patent is subject to a terminal disclaimer.

(21) Appl. No.: 12/118,284

(22) Filed: May 9, 2008

(65) Prior Publication Data

US 2008/0276957 A1    Nov. 13, 2008

Related U.S. Application Data

(60) Continuation of application No. 10/709,622, filed on May 18, 2004, now abandoned, which is a division of application No. 10/043,190, filed on Jan. 14, 2002, now Pat. No. 6,758,224.

(30) Foreign Application Priority Data

Jan. 22, 2001 (JP) ................................ 2001-012600

(51) Int. Cl.
  B08B 7/04    (2006.01)
  B08B 7/00    (2006.01)
(52) U.S. Cl. ........................ 134/22.18; 134/22.1; 134/19
(58) Field of Classification Search ................. 134/22.1, 134/22.18, 19, 902; 438/905; 216/63, 64, 216/67; 156/345.29, 345.35, 345.47
See application file for complete search history.

(56) References Cited

U.S. PATENT DOCUMENTS

| | | | |
|---|---|---|---|
| 3,676,566 | A | 7/1972 | McBride |
| 4,792,378 | A | 12/1988 | Rose et al. |
| 4,986,033 | A | 1/1991 | Weil |
| 5,039,904 | A | 8/1991 | Kosmatka et al. |
| 5,304,250 | A | 4/1994 | Sameshima et al. |
| 5,336,326 | A | 8/1994 | Karner et al. |
| 5,365,995 | A | 11/1994 | Warner |
| 5,433,786 | A | 7/1995 | Hu et al. |
| 5,433,787 | A | 7/1995 | Suzuki et al. |

(Continued)

FOREIGN PATENT DOCUMENTS

JP    5-21393    1/1993

(Continued)

OTHER PUBLICATIONS

Nogami, U.S. Appl. No. 12/566,205, entitled "Vacuum Processing Apparatus" filed Sep. 24, 2009.

(Continued)

*Primary Examiner* — Alexander Markoff
(74) *Attorney, Agent, or Firm* — Buchanan Ingersoll & Rooney PC

(57) ABSTRACT

A CVD vacuum vessel including an electrically conductive partition plate which divides the interior of the vacuum vessel into a plasma generating space and a film-deposition processing space, and an electrically conductive spiral shield. The electrically conductive partition plate has a plurality of through-holes connecting the plasma generating space to the film-deposition processing space and a heater for heating the electrically conductive partition plate. The partitioning plate is mounted to the vacuum vessel by means of a mounting screw such that electrical contact between the partitioning plate and the vacuum vessel is achieved through said spiral shield.

11 Claims, 3 Drawing Sheets

U.S. PATENT DOCUMENTS

| | | | |
|---|---|---|---|
| 5,447,568 A | 9/1995 | Hayakawa et al. | |
| 5,449,410 A | 9/1995 | Chang et al. | |
| 5,472,565 A | 12/1995 | Mundt et al. | |
| 5,525,159 A | 6/1996 | Hama et al. | |
| 5,556,474 A | 9/1996 | Otani et al. | |
| 5,624,498 A | 4/1997 | Lee et al. | |
| 5,630,917 A | 5/1997 | Guo | |
| 5,690,795 A * | 11/1997 | Rosenstein et al. | 204/192.1 |
| 5,766,364 A | 6/1998 | Ishida et al. | |
| 5,792,272 A | 8/1998 | van Os et al. | |
| 5,942,075 A | 8/1999 | Nagahata et al. | |
| 5,958,510 A | 9/1999 | Sivaramakrishnam et al. | |
| 5,997,649 A * | 12/1999 | Hillman | 118/715 |
| 6,026,764 A | 2/2000 | Hwang | |
| 6,074,518 A | 6/2000 | Imafuku et al. | |
| 6,074,519 A | 6/2000 | Lee et al. | |
| 6,083,363 A | 7/2000 | Ashtiani et al. | |
| 6,086,677 A | 7/2000 | Umotoy et al. | |
| 6,132,552 A | 10/2000 | Donohoe et al. | |
| 6,162,323 A | 12/2000 | Koshimizu | |
| 6,203,620 B1 | 3/2001 | Moslehi | |
| 6,245,192 B1 | 6/2001 | Dhindsa et al. | |
| 6,245,396 B1 | 6/2001 | Nogami | |
| 6,283,130 B1 | 9/2001 | Tamura | |
| 6,296,711 B1 | 10/2001 | Loan et al. | |
| 6,302,964 B1 | 10/2001 | Umotoy et al. | |
| 6,313,017 B1 | 11/2001 | Varhue | |
| 6,368,987 B1 | 4/2002 | Kopacz et al. | |
| 6,427,623 B2 * | 8/2002 | Ko | 118/723 E |
| 6,435,428 B2 | 8/2002 | Kim et al. | |
| 6,436,193 B1 | 8/2002 | Kasai et al. | |
| 6,444,039 B1 | 9/2002 | Nguyen | |
| 6,499,425 B1 | 12/2002 | Sandhu et al. | |
| 6,534,007 B1 | 3/2003 | Blonigan et al. | |
| 6,538,734 B2 | 3/2003 | Powell | |
| 6,663,715 B1 | 12/2003 | Yuda et al. | |
| 6,758,224 B2 | 7/2004 | Nogami | |
| 6,769,439 B2 | 8/2004 | Tamura | |
| 6,818,096 B2 | 11/2004 | Barnes et al. | |
| 6,886,491 B2 | 5/2005 | Kim et al. | |
| 6,892,669 B2 | 5/2005 | Xu et al. | |
| 6,893,978 B1 | 5/2005 | Kula | |
| 7,033,444 B1 | 4/2006 | Komino et al. | |
| 7,094,315 B2 | 8/2006 | Chen et al. | |
| 7,267,724 B2 | 9/2007 | Tanaka et al. | |
| 2001/0042512 A1 | 11/2001 | Xu et al. | |
| 2002/0076492 A1 | 6/2002 | Loan et al. | |
| 2002/0096188 A1 | 7/2002 | Nogami | |
| 2002/0152960 A1 | 10/2002 | Tanaka et al. | |
| 2002/0197402 A1 | 12/2002 | Chiang et al. | |
| 2003/0079983 A1 | 5/2003 | Long et al. | |
| 2004/0025788 A1 | 2/2004 | Ogasawara et al. | |
| 2004/0099213 A1 | 5/2004 | Adomaitis et al. | |
| 2004/0194708 A1 | 10/2004 | Nogami | |

FOREIGN PATENT DOCUMENTS

| | | | |
|---|---|---|---|
| JP | 6-260434 | | 9/1994 |
| JP | 7-106319 | | 4/1995 |
| JP | 7-201749 | | 8/1995 |
| JP | 8-330243 | | 12/1996 |
| JP | 9-272979 | | 10/1997 |
| JP | 10-2837087 | | 10/1998 |
| JP | 10-340858 | A | 12/1998 |
| JP | 11-157692 | A | 6/1999 |
| JP | 11-312674 | A | 11/1999 |
| JP | 2000-345349 | | 12/2000 |
| JP | 2001-011857 | A | 1/2001 |
| JP | 2001-135628 | A | 5/2001 |
| JP | 2002-180257 | | 6/2002 |
| JP | 2002-212736 | A | 7/2002 |
| JP | 2002212732 | A * | 7/2002 |
| KR | 10-0243446 | B1 | 2/2000 |

OTHER PUBLICATIONS

Office Action issued in corresponding Japanese Patent Application No. 2001-012600, mailed Dec. 7, 2010.

Riccardo d'Agostino et al., "Plasma Etching of Si and $SiO_2$ in $SF_6$-$O_2$ Mixtures", J. Appl. Phys. 52(1), Jan. 1981, pp. 162-167.

Shingo Kadomura et al., Anisotropic Etching Using Deposition of Sulfur, Sony Corporation, Semiconductor World, Jan. 1993, pp. 1-11, and translation.

Ken Fujita et al., "X-Ray Photoelectron Spectroscopic Studies on Pyrolysis of Plasma-Polymerized Fluorocarbon Films on Si", Jpn. J. Appl. Phys. vol. 34 (1995), pp. 304-306, Part 1, No. 1, Jan. 1995.

Robert C. Reid et al., "The Properties of Gases and Liquids", McGraw-Hill, Inc., Appendix B. Index, 1987.

R. Byron Bird et al., "Transport Phenomena", Jon Wiley & Sons, pp. 508-509 and 512-513, 1960.

Robert C. Reid et al. "Lennard-Jones Potentials as Determined from Viscosity Data (Appendix B)", *The Properties of Gases and Liquids*, McGraw-Hill, Inc., Copyright 1987, p. 734, Index.

R. Byron Bird et al. "Diffusivity and the Mechanisms of Mass Transport; Theory of Ordinary Diffusion in Gases at Low Density", *Transport Phenomena*, John Wiley & Sons, Inc., Copyright 1960, p. 508-513.

A new technique for diagnostics of a radio-frequency parallel-plate remote plasma; N. Sano et al.; Appl. Phys. Lett 65 (2), Jul. 11, 1994 pp. 162-164.

Infrared spectroscopic study of $SiO_x$ films produced by plasma enhanced chemical vapor deposition; J, Vac.Sci. Technol. A4(3), May/Jun. 1986; pp. 689-694.

Improvement of structural and electrical properties in low-temperature gate oxides for poly-Si TFTs by controlling $O_2$/$Sih_4$ ratios; AM-LCD 1997; pp. 87-90, Sep. 1997.

"Flow of Atoms and Molecules-Rarefied Gas Dynamics and its Applications", section 2.6.4, The Japan Society of Mechanical Engineers, 1996, Kyoritsu Shuppan Co., Ltd.

* cited by examiner (a)

(b)

METHOD OF CLEANING A CVD DEVICE

CROSS-REFERENCE TO RELATED APPLICATIONS

This application claims the benefit of Japanese Patent Application Number 2001-012600, filed in Japan on Jan. 22, 2001, in the Japanese Intellectual Property Office, and is a continuation of parent U.S. application Ser. No. 10/709,622, filed May 18, 2004, which is a divisional of grandparent U.S. application Ser. No. 10/043,190, filed Jan. 14, 2002, now U.S. Pat. No. 6,758,224, the entire contents of which are hereby incorporated by reference.

BACKGROUND OF THE INVENTION

1. Technical Field of the Invention

The invention relates to a method of cleaning a chemical vapor deposition system(referred to in the present patent specification as "CVD system").

2. Description of Related Art

It is known to use high-temperature polysilicon-type TFTs (thin-film transistors) and low-temperature polysilicon-type TFTs in methods of manufacturing liquid crystal displays.

In order to obtain high-quality oxide films in the manufacturing methods using high-temperature polysilicon-type TFTs, quartz substrates which could withstand high temperatures of 1000° C. or more are used.

In contrast, in the manufacture of low-temperature polysilicon-type TFTs, it is necessary to carry out film deposition in a low-temperature environment (for example 450° C. or less) because a glass substrate which is customary for TFTs is used. Methods for manufacturing liquid crystal displays using low-temperature polysilicon-type TFTs have the advantage that they do not require special substrates to be used. Such methods have been put into practice in recent years and their production volume is continuing to expand.

In the manufacture of liquid crystal displays using low-temperature polysilicon-type TFTs, plasma CVD is used when a silicon oxide film is deposited as a gate insulator film at low temperature. When silicon oxide film is deposited by plasma CVD, silane, tetraethoxysilane (TEOS) and the like are used as typical materials in gas form.

If silane, or the like, is used as the material in gas form and silicon oxide film is deposited by means of plasma, in the conventional plasma CVD system, silicon oxide film is deposited on the surface of a substrate by introducing the material in gas form and oxygen, or the like, into the space in front of said substrate, generating plasma in a gas mixture comprising the material in gas form and the oxygen or the like and exposing the substrate to said plasma.

The conventional plasma CVD systems are configured in such a way that the material in gas form is supplied directly into the plasma which is generated inside the plasma CVD system. For this reason, with the configuration of conventional plasma CVD system, there is a problem that the high-energy ions are injected from the plasma present in the space in front of the substrate onto the film-depositing face of the substrate and they damage the silicon oxide film and degrade the properties of the film. Furthermore, as the material in gas form is fed directly into the plasma, particles are produced by violent reaction between the material in gas form and the plasma, and as a result the yield is reduced.

In order to solve the above mentioned problems, an attempt to improve the CVD device of the remote plasma type is disclosed in Japan Patent Application Serial Number H11-157692.

The CVD device disclosed in the above mentioned the patent application, Serial Number H11-157692, produces active seeds (radicals) by generating plasma inside a vacuum vessel, carries out the film-deposition processing on a substrate, accommodated inside said vacuum vessel, by means of these active seeds and material in gas form.

That is to say, an electrically conductive partition plate which divides the interior of said vacuum vessel into two chambers is provided in said vacuum vessel. The interior of one of these two chambers is formed as a plasma-generating space in which high-frequency electrode are arranged, and the interior of the other chamber is formed as a film-deposition processing space in which a substrate-holding mechanism on which a substrate is mounted is arranged. A plurality of through-holes which are made to pass from the plasma-generating space to the film-deposition processing space are formed in this electrically conductive partition plate. Furthermore, this electrically conductive partition plate has an interior space which is divided off from the plasma-generating space and communicates with the film-deposition processing space via a plurality of diffusion holes. The system is configured in such a way that the material in gas form is supplied to the interior space of this electrically conductive partition plate from the outside and fed into said film-deposition processing space through said plurality of diffusion holes. The active seeds which are generated in said plasma-generating space are fed into the film-deposition processing space through the plurality of through-holes formed in said electrically conductive partition plate and film processing is performed on said substrate in film-deposition processing space.

In said CVD system disclosed in Patent Application Serial Number H11-157692, the plurality of through-holes which are made to pass from said plasma-generating space and are provided in said electrically conductive partition plate to said film-deposition processing space are formed to satisfy the condition $uL/D>1$ when the gas flow velocity inside said through-holes is u, the effective length of the through-holes is L and the coefficient of mutual gas diffusion is D.

As the plasma-generating space and film-deposition processing space are separated by means of the electrically conductive partition plate in said CVD system proposed in Patent Application Serial Number H11-157692, the device is configured in such a way that the processing surface of the substrate which is arranged in the film-deposition processing space is not exposed to the plasma. In addition, a plurality of through-holes which are made to pass from the plasma-generating space to film-deposition processing space are formed in the electrically conductive partition plate. However, because these through-holes are formed so as to satisfy the above mentioned condition, the material in gas form which is fed into the film-deposition processing space is prevented from diffusing back into the plasma-generating space.

It is to be noted that in Patent Application Serial Number H11-157692, a CVD system is proposed which is formed in such a way that said plurality of diffusion holes also fulfill the above mentioned condition placed on the through-holes, in order to prevent the active species fed into the film-deposition processing space from diffusing back into the interior space of the partition plate.

In fact, Patent Application Serial Number H11-157692 discloses a CVD system in which plasma is generated between the high-frequency electrode and the lower face part of the upper part of the vacuum vessel and in the space which is bounded by the high-frequency electrode and the partition wall comprised of vacuum vessel which makes up the CVD system and the electrically conductive partition plate, both of which are at ground potential. Further more, the variation of the above mentioned CVD system is disclosed in which, the high frequency electrodes are installed in upper positions in the plasma-generating space and plasma electrical discharge is produced between the high-frequency electrode and the electrically conductive partition plate.

Generally, there are problems common to CVD systems that when films continue to be deposited, they are also deposited on the substrate-supporting elements and the interior wall of the film-depositing chamber and the like. When they drop off onto the substrate during film deposition as particles, they cause to be disconnect circuits of the wiring and result in the reduction of the yield of manufactures products.

For this reason, apart from the film-depositing process, optimum cleaning is carried out after processing the prescribed number of substrates, said cleaning being performed using particular cleaning gases according to differences in the plasma-forming method and structures and compositions of the deposited materials. The cleaning of this type of CVD device is an important process, as is the film-deposition process in the implementation of stabilized operation of the CVD system without exposing the interior of the depositing chamber to the atmospheric ambient.

OBJECTS AND SUMMARY

An object of the present invention is to provide an optimum cleaning process for the CVD system disclosed in Patent Application Serial Number H11-157692.

In the manufacture of large liquid crystal displays in which low temperature polysilicon-type TFTs are used, the CVD device disclosed in Patent Application Serial Number H11-157692 uses plasma and deposits silicon oxide film on a large-area substrate using material in gas form, such as silane, in order to form at low temperatures a suitable silicon oxide film as a gate insulator film. An appropriate cleaning method is proposed which is suitable for this disclosed CVD system and a method for cleaning the CVD system is proposed in which the generation of particles is sufficiently suppressed, high manufacturing-product yield by means of said CVD system is maintained and said CVD system can carry out stable operations without exposing the interior of the depositing chamber to the atmospheric ambient.

A method of cleaning a CVD device according the present invention can be used in the CVD system disclosed in Patent Application Serial Number H11-157692. According to one aspect of the present invention with an electrically conductive partition plate placed at ground potential, cleaning gas is fed into a plasma-generating space, active species are generated by applying high-frequency electric power to the high-frequency electrodes arranged in said plasma-generating space, said generated active species are fed into a film-deposition processing space through a plurality of through-holes in said electrically conductive partition plate and said film-deposition processing space is cleaned by means of said active species fed into this film-deposition processing space.

That is to say, in the CVD system which is disclosed in Patent Application Serial Number H11-157692, the plasma-generating space and the film-deposition processing space are separated from one another by an electrically conductive partition plate and a plurality of through-holes is made to pass from the plasma-generating space to the film-deposition processing space in said electrically conductive partition plate. The through-holes are formed such that they fulfil conditions which prevent back-diffusion to the plasma-generating space side of the material in gas form fed from the film-deposition processing space.

Cleaning gas is fed directly into the plasma-generating space, which is separated from the film-deposition processing space by the electrically conductive partition plate, and active species (radicals) are generated by applying high-frequency electric power to the high-frequency electrode inside said plasma-generating space. The generated active species (radicals) are fed into the film-deposition processing space through the plurality of through-holes in the electrically conductive partition plate, which is at ground potential, and the film-deposition processing space is cleaned by means of the active species fed into the film-deposition processing space.

According to the present invention, it is possible to use fluoride gas as the cleaning gas. One or more types of the fluoride gases from such as, for example, $NF_3$, $F_2$, $SF_6$, $CF_4$, $C_2F_6$, $C_3F_8$ can be used.

When fluoride gas is used as the cleaning gas to apply the present invention to the actual cleaning, after processing of a prescribed number of silicon oxide films and a-Si films, fluoride gas is fed into the plasma-generating space, and active species (fluorine radicals) are generated by striking electrical discharge in the plasma-generating space. The fluorine radicals are fed into the film-deposition processing space through the plurality of through-holes in the electrically conductive partition plate at ground potential, and the film-deposition processing space is cleaned. In other words, deposits attached to the inner walls of the vacuum vessel and to the surface of the substrate-holding mechanism, and the like, react with said fluorine radicals and thus can be removed and expelled from an exhaust port.

In this respect, oxygen gas can be added to the above mentioned fluoride gas in order to further the dissociation into the fluorine atom radicals. For example, J. Appl. Phys. Vol. 52 (1981) p. 162 proposes that by adding oxygen with a concentration of 60% or less, it is possible to increase the density of fluorine atom radicals in comparison with cases in which there is no additive.

If fluoride gas is used, as mentioned above, the radicals generated inside the plasma-generating space are fluoride radicals or fluorine atom radicals. However, but in cases where the deposits on the film-processing space and the like are carbonates, $O_2$ is used as the cleaning gas.

In addition, in cases in which the density of the plasma is low and a sufficient cleaning speed is not obtained, if an inert gas with a high ionization potential such as He, Ne, Ar, Kr and Xe is admixed with the cleaning gas, it is possible to raise the temperature of the electrons by the admixture of said inert gas, to further the dissociation of the cleaning gas such as fluoride gas and to increase the cleaning speed.

In cases in which the method of cleaning a CVD system according to the present invention is implemented using fluoride gas as the cleaning gas as mentioned above, the cleaning gas which is adsorbed in the inner face of the through-holes, in the partition plate and on the partition plate during the cleaning step may desorb in the progress of the film-depositing step after the completion of the cleaning, may be discharged into the film-deposition processing space from the interior of the partition plate, and fluorine which is produced due to cleaning gas may be included in the thin film during the film deposition after the completion of the cleaning and degrades the intrinsic properties of the thin film.

The present application proposes a method of cleaning a CVD system which, as mentioned above, can suppress in advance the above-mentioned problem which occurs in cases in which fluoride gas is used as the cleaning gas in the cleaning method according to the present invention.

In the method of cleaning the above-mentioned CVD system, according to one aspect of the present invention, when, with the electrically conductive partition plate at ground potential, cleaning gas is fed into said plasma-generating space, active species are generated by applying high-frequency electric power to the high-frequency electrode arranged in the interior of said plasma-generating space and said generated active species are fed into said film-deposition processing space through the plurality of through-holes in said electrically conductive partition plate. The electrically conductive partition plate is heated, and more specifically, heating of said electrically conductive partition plate can be carried out within a temperature range which suppresses the adsorption of fluorine onto the inner circumferential face of said through-holes and the surface of the partition plate.

The temperature range at which the adsorption of fluorine onto the inner circumferential face of the through-holes and the surface of the partition plate is prevented varies respectively depending on the type of fluoride gas used as cleaning gas. For example, in cases in which the cleaning gas is a fluorocarbon gas such as CF4, C2F6, C3F8 and in cases when the cleaning gas is a nitrogen fluoride gas such as NF3 the electrically conductive partition plate is heated to 200° C. or more, and in cases when the cleaning gas is a fluorosulfur gas such as SF6 the electrically conductive partition plate is heated to 100° C. or more.

Such heating of the electrically conductive partition plate can be carried out, for example, by housing heating means, such as a heater, in the electrically conductive partition plate.

With the respective cleaning method, as it is possible to heat the electrically conductive partition plate to the necessary temperature at which the adsorption of cleaning gas onto the inner circumferential face of said plurality of through-holes provided in said electrically conductive partition plate and the surface of the partition plate is inhibited, said heating being in accordance with the type of fluoride gas used as cleaning gas, it is possible to remove the fluorine which is absorbed onto the inner circumferential face of the through-holes and the surface of the partition plate during the cleaning and to prevent in advance the fluorine contamination of the thin film during the film deposition of the film-depositing process after the completion of cleaning.

DETAILED DESCRIPTION OF THE PREFERRED EMBODIMENTS

An embodiment of a CVD system in which a cleaning method according to the present invention can be applied will be described with reference to FIGS. 1 and 2.

Figure 1:
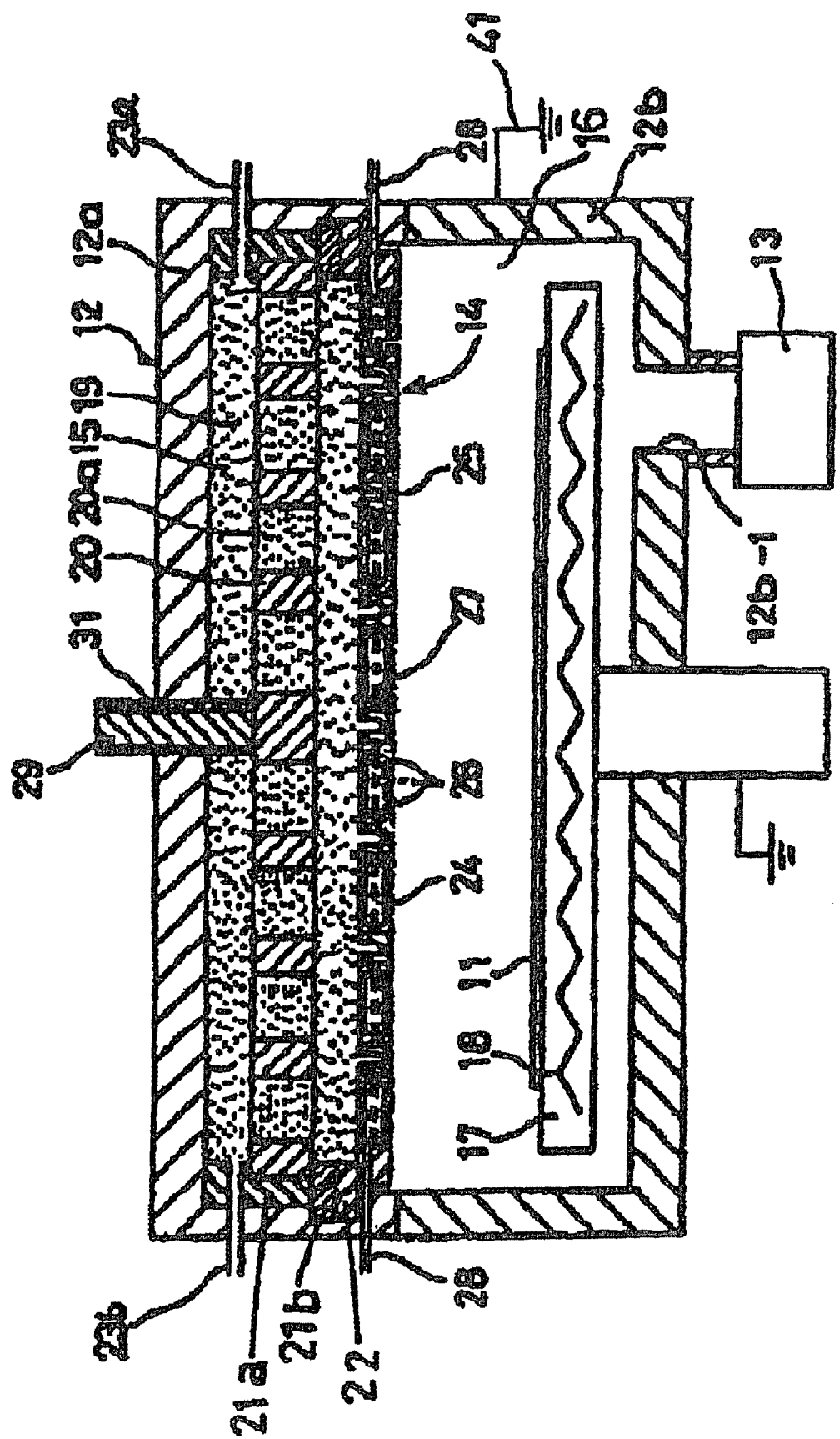
FIG. 1 is a view of a vertical section showing the configuration of a first embodiment of a CVD system in which the present invention can be applied.
Figure 2:
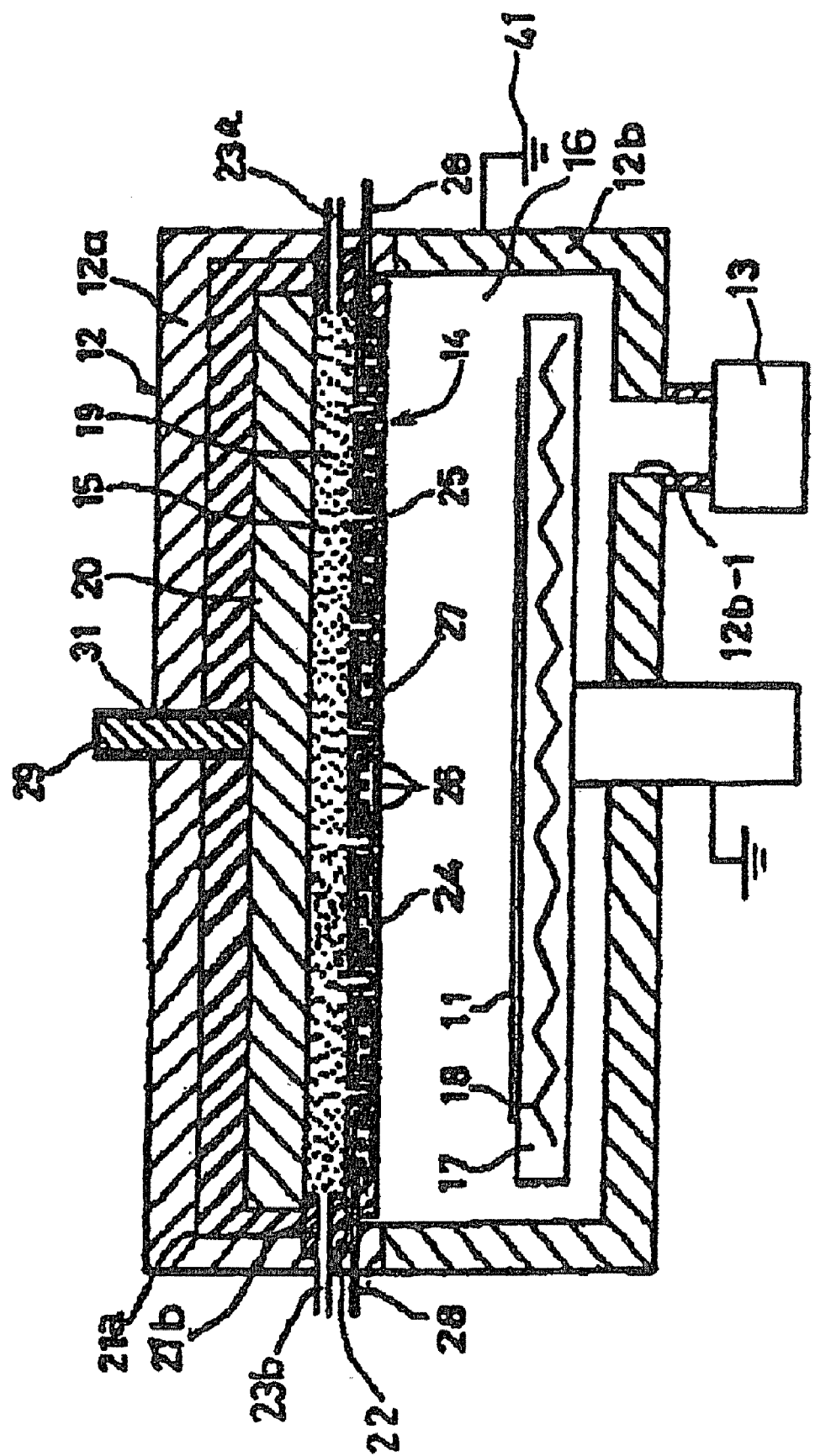
FIG. 2 is a view of a vertical section showing the configuration of a second embodiment in which the present invention can be applied.

The CVD device shown in FIGS. 1 and 2 are preferably used when silane is employed as the material in gas form, and silicon oxide film is formed as the gate insulator film on an upper surface of a glass substrate 11 which is customary for a TFT.

When film-deposition processing is carried out in the vacuum vessel 12, the vessel interior is maintained in a desired vacuum state by means of an exhaust device 13. The exhaust device 13 is connected to an exhaust port 12b-1 formed in the vacuum vessel 12.

In the interior of the vacuum vessel 12, a partition plate 14, which is made of electrically conductive material, is installed in a horizontal state. The partition plate 14, which has a planar, for example, rectangular, shape, is arranged in such a way that its peripheral part forms a sealed state by pushing it down and attaching it to the lower face of the electrically conductive material fixing part 22. In this way, the interior of the vacuum vessel 12 is separated into two chambers in the upward and downward directions by the partition plate 14. The upper chamber is made into the plasma-generating space 15, and the lower chamber is made into the film-deposition processing space 16.

The partition plate 14 has a desired specific thickness and is entirely in the shape of a flat plate. Furthermore, it is of planar shape similar to the shape of the horizontal section of the vacuum vessel 12. An interior space 24 is formed in the partition plate 14, and a plurality of through-holes 25 which fulfill specific conditions are formed and distributed throughout the interior space 24. The plasma-generating space 15 and the film-deposition processing space 16 communicate only via the through-holes 25.

A glass substrate 11 is arranged on a substrate-holding mechanism 17 installed in the film-deposition processing space 16. The glass substrate 11 is essentially parallel with the partition plate 14 and is arranged in such a way that its film-depositing face (upper face) is facing the lower face of the partition plate 14. The potential of the substrate-holding mechanism 17 is kept at ground potential 41 which is the same potential as the vacuum vessel 12. Furthermore, a heater 18 is installed in the substrate-holding mechanism 17. This heater 18 is used to keep the temperature of the glass substrate 11 at a prescribed temperature.

Figure 3:
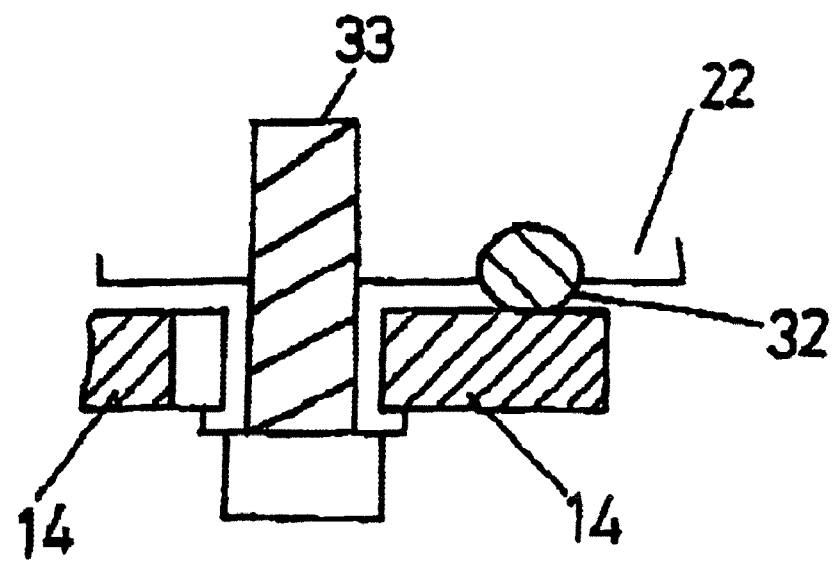
FIG. 3(a) is an enlarged sectional view of places where the partition plate is fixed.
FIG. 3(b) is an enlarged sectional view of an embodiment of the partition plate in which heating means are housed.
Figure 3:
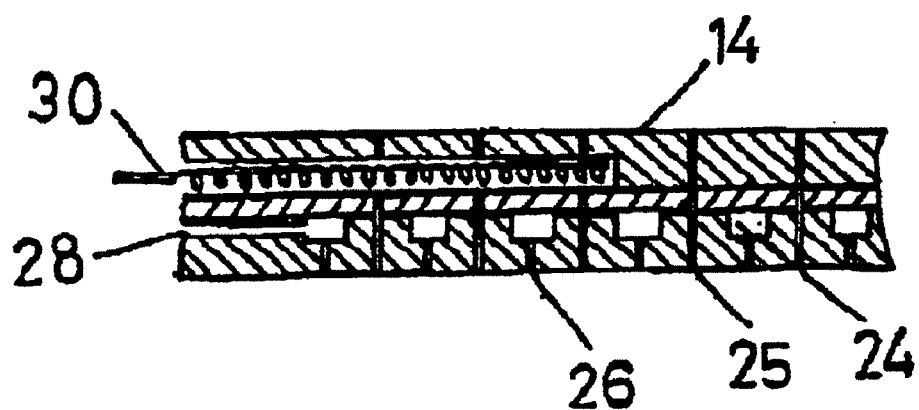

The vacuum vessel 12 is configured, from the point of view of improving its assembly properties, of an upper vessel 12a which forms the plasma-generating space 15 and a lower vessel 21b which forms the film-deposition processing space 16. When the vacuum vessel 12 is formed by assembling the upper vessel 12a and lower vessel 12b, the electrically conductive partition plate 14 is installed between the two. In order to ensure that it is placed at ground potential, the partition plate 14 is mounted so as to make contact with the electrically conductive material fixing part 22, in the manner as shown in FIG. 3(a), for example. In this way, the separated plasma-generating space 15 and film-deposition processing space 16 are formed on the upper and lower sides of the partition plate 14 and the plasma-generating space 15 is formed by means of the partition plate 14 and upper vessel 12a.

In the embodiment shown in FIG. 1, the region in which plasma 19 is generated in the plasma-generating space 15 is formed from the partition plate 14, upper vessel 12a and plate-shaped electrode (high-frequency electrode) 20 which are arranged in an approximately central position.

A plurality of holes 20a are formed in the electrodes 20. The electrodes 20 are supported and fixed by means of two insulator parts 21a, 21b which are installed along the inner face of the side part of the upper vessel 12a.

An is to be noted that the electrically conductive element 32 is sandwiched between the partition plate 14 and the fixing part 22, which is made of electrically conductive material and which is positioned inside the vacuum vessel 12. The partition plate is fixed to the fixing part 22 by means of a mounting screw 33 (FIG. 3(a)). The electrically conductive element 32 is a cord-shaped electrically conductive element which has spring properties in the manner of what is referred to as a spiral shield, and it ensures electric contact between the partition plate 14 and the fixing part at ground potential and absolutely no leakage to the film-processing space of high frequency waves. However, provided that the partition plate 14 is mounted in such a way that it is reliably kept at ground potential when the CVD device is being cleaned, it is not restricted to the structure in FIG. 3(a).

In addition, the heater 30 for heating the interior partition plate 14 can be accommodated in the partition plate 14 as shown in FIG. 3(b). In this case, a feed pipe 28 is arranged above the heater 30.

In cases in which fluoride gas is used as the cleaning gas, the heater 30 is placed in such a way that the partition plate 14 is heated up to at least the necessary temperature, at which adsorption of the cleaning gas into the inner circumferential face of the plurality of through-holes 25 provided in the partition plate 14 and the surface of the partition plate is prevented, said heating being carried out in accordance with the type or types of fluoride gas. In this respect, the number of heaters 30 accommodated, and the state in which they are arranged, can be freely determined in accordance with the size of the partition plate 14 and the necessary parameters of the heating temperature, and the like. In addition, it is possible to accommodate in the partition plate 14, in the same way as the heater 30, a thermocouple detection sensor (not shown in the figure) or the like for detecting the heating temperature of the partition plate 14.

Provided that the structure and heating means and the like for heating the partition plate 14 are configured so as to fulfill the above objective, they are not restricted to the form shown in FIG. 3(b).

Feed pipes 23a, 23b, which introduce oxygen gas and cleaning gas into the plasma-generating space 15 from the outside, are installed in an insulator part 21a. The oxygen gas feed pipe 23a and cleaning gas feed pipe 23b are connected to an oxygen gas supply and cleaning gas supply (neither shown in the figure) through a mass flow controllers which controls the flow.

A fluoride gas such as NF3, F2, SF6, CF4, C2F6, C3F8 can be used as the cleaning gas.

In cases in which the etch rate of the cleaning gas when etching silicon oxide film is low, it is possible to add to the cleaning gas an inert gas such as He, Ne, Ar, Kr or Xe which is intended to increase the radical density by further raising the dissociation rate of the cleaning gas as a result of the rise of electron temperature of the plasma.

As the method introducing these additive gases, it is possible to continuously introduce these additive gases from oxygen gas feed pipe 23a, or from the gas feed pipe midway connected to the cleaning gas pipe 23b, or newly installed independent feed gas pipe exclusively provided for the additive gases.

In the interior of the vacuum vessel 12, the plasma-generating space 15 is separated from the film-deposition processing space 16 by the partition plate 14. However, a plurality of through-holes 25, which fulfill specific conditions, are formed in the partition plate 14 so as to penetrate the interior space 24. The plasma-generating space 15 and the film-deposition processing space 16 communicate only via the through-holes 25.

Furthermore, a plurality of diffusion holes 26 which supply material in gas form to the film-processing space 16 are formed in the lower wall of the partition plate 14.

In order to prevent the material in gas form fed into the film-deposition processing space 16 from diffusing back to the plasma-generating space 15 side, the above mentioned through-holes 25 are formed so as to fulfill the condition $uL/D > 1$ where the gas flow velocity inside the through-holes 25 is u, the effective length of these through-holes 25 is L and the coefficient of mutual gas diffusion (the coefficient of mutual gas diffusion of two types of gas on the two sides of the through-holes 25) is D. If said conditions which are applied to through-holes 25 is applied, to the diffusion-holes, it more effectively prevents the active species from diffusing back to the interior space 24 of the partition plate 14.

A feed pipe 28 for introducing material in gas form is connected to the interior space 24. The feed pipe 28 is arranged so as to be connected from the outside. In addition, in order to ensure that the material in gas form is supplied uniformly from the diffusion holes 26, a homogenizing plate 27, which has a plurality of holes perforated therein, is installed approximately horizontally in the middle of the interior space 24.

An electric power feed rod 29, which is connected to the electrodes 20, is installed in a ceiling part of the upper vessel 12a. High-frequency electric power to be discharged to the electrodes 20 is supplied by the electric power feed rod 29. The electrodes 20 can function as high-frequency electrode.

The electric power feed rod 29 is covered by an insulator 31, and insulation from other metal surface can be.

In the CVD system according to the embodiment shown in FIG. 2 the structure of the electrodes is modified in comparison with the embodiment shown in FIG. 1, and the high-frequency electrode 20 are installed in a position on the upper side of the plasma-generating space 15, plasma electric discharges being generated between the high-frequency electrodes 20 and the partition plate 14.

The basic structural elements are essentially the same as the structural elements of the CVD system according to the embodiment presented in FIG. 1 and identical reference symbols have been used for common structural elements, hence there will not be repetition of the detailed description here.

A characteristic configuration of the embodiment shown in FIG. 2 is provided with an insulator part 21a on the inner side of the ceiling part of the upper vessel 12a, and the electrodes 20 are arranged on the underside of said insulator part 21a. There are no holes 20a formed in the electrodes 20 so that it has the shape of a single plate. The plasma-generating space 15 is formed by the electrodes 20 and partition plate 14, which forms a parallel plate type electrode configuration.

The rest of the configuration is essentially the same as the configuration of the first embodiment.

A general description will be given of the film-deposition method which uses a cleaning method according to the invention, with respect to the CVD system configured as above. A glass substrate 11 is transferred to the interior of the vacuum vessel 12 by means of a transferring robot (not shown in the figure), and is placed on the substrate-holding mechanism 17. The interior of the vacuum vessel 12 is exhausted by means of the exhaust device 13, and a prescribed vacuum state is maintained by reducing the pressure. Next, oxygen gas is fed into the plasma-generating space 15 of the vacuum vessel 12 through the oxygen gas feed pipe 23a.

A material in gas form, for example silane, is fed into the interior space 24 of the partition plate 14 through the feed pipe 28. The silane is fed firstly into the upper side part of the interior space 24, it is homogenized by the homogenizing plates 27 and moved to the lower side part, and next fed directly into the film-deposition processing space 16 through the diffusion holes 26, i.e., without coming into contact with the plasma. The substrate-holding mechanism 17 which is installed in the film-deposition processing space 16 is maintained in advance at a prescribed temperature because electricity is transmitted to the heater 18.

In the state mentioned above, high-frequency electric power is supplied to the electrodes 20 via the electric power feed rod 29. Electric discharge is produced by means of this high-frequency electric power, and oxygen plasma 19 is generated in the vicinity of the electrode 20 inside the plasma-generating space 15. By virtue of the fact that oxygen plasma 19 is generated, radicals (excited active species) which are neutral excited species are generated, silicon oxides are deposited on the surface of the substrate 11.

Next, a description will be given of a cleaning method according to the invention which is applied to the above-mentioned CVD system, for the case in which NF3 gas is used as the cleaning gas.

Cleaning is performed periodically at every preset time interval or when a preset number of substrates are processed. For cleaning, after stopping of a material gas feeding such as silane gas, and by replacing the oxygen gas which is introduced into the plasma generation space at film deposition period with fluorine gas. System configuration is not different by almost same even if used cleaning gas differs.

A partition plate 14 which is formed from electrically conductive material is placed at ground potential, NF3 gas as cleaning gas is fed into the plasma-generating space 15, and fluorine radicals are generated inside the plasma-generating space 15 by supplying high-frequency electric power to the electrodes 20. The fluorine radicals which are generated are fed into the film-deposition processing space 16 through the plurality of through-holes 25 in the partition plate 14, and by this means the interior of the film-deposition processing space 16 is cleaned.

It is also possible to admix an inert gas, such as Ar gas, or oxygen gas to the cleaning gas (NF3) in order to improve the cleaning speed.

In addition, oxygen can be used as the cleaning gas in cases where carbonates are deposited.

In addition, in cases where fluoride gas is used as the cleaning gas, the adsorption of fluorine onto the inner circumferential face of the through-holes 25 and the surface of the partition plate must be prevented, and depending on the type of fluoride gas used as the cleaning gas, it is desirable to heat the partition plate 14 to 200° C. or more by means of the heater 30, when fluorocarbon gas such as CF4, C2F6, C3F8 or nitrogen fluoride gas such as NF3 are used, for example. Or, it is desirable to heat the substrate 14 to a temperature of 100° C. or more in cases when using flurosulfur gas such as SF6, while carrying out said cleaning process.

An example of specific setting values for the cleaning method for a silicon oxide film according to the present invention is given below.

Ar gas for speeding up the dissociation of cleaning gas was admixed to the cleaning gas (NF3) with an Ar gas flow rate of 100 cm3/min (0.18 g/min) under standard conditions with a power applied to the 60 MHz high-frequency electrodes 20 of 2 kW, and a mass flow rate, under standard conditions, of the NF3 cleaning gas of 200 cm3/min (0.63 g/min). The pressure of the film-deposition processing space 16 was 16 Pa. The speed with which the silicon oxide in the film-deposition processing space 16 was removed, in other words the cleaning speed, was 30 to 40 nm/min.

As has been made clear in the description above, by means of the present invention, it is possible to provide an optimum cleaning method for a system which can deposit silicon oxide film and the like on a large-area substrate using a material in gas form such as silane by means of plasma CVD, in which CVD system, for example, the interior of the vacuum vessel is divided into a plasma-generating space and a film-deposition processing space by the position of an electrically conductive partition plate with a plurality of through-holes or diffusion holes formed therein, and active species are generated in the plasma-generating space and are fed into the film-deposition processing space through a plurality of holes in said partition plate.

With the cleaning method according to the present invention, by performing optimum cleaning after film-deposition, the generation of particles can be reduced and the CVD system of the present form configuration can be used efficiently in the manufacture of large-area substrates without interpret due to exposing the interior of the depositing chamber to the atmospheric ambient for cleaning, and yet there is no product contamination due to fluorines caused by the cleaning gas, and it is possible to operate continuously in a stabilized fashion without interpret due to exposing the interior of the depositing chamber to the atmospheric ambient for cleaning, which results in a high yield.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A cleaning method executed in a vacuum vessel which has a partition plate which divides an interior space of the vacuum vessel into a first space and a second space in which a substrate to be processed is arranged and has a plurality of through-holes for communicating between the first space and the second space, the method comprising:
   feeding one or more types of fluoride gas and any of He, Ne, Ar, Kr, and Xe as cleaning gas into the first space;
   a plasma generating step of generating active species by applying high-frequency electric power to electrodes arranged in the first space; and
   feeding the active species generated in the plasma generating step from the first space into the second space through the plurality of through-holes,
   wherein a peripheral portion of the partition plate is fixed to an inner wall of the vacuum vessel via an electrically conductive member which has spring properties, and the partition plate is kept at a ground potential.

2. The method according to claim 1, further comprising maintaining the partition plate at a ground potential in the plasma generating step.

3. The method of claim 1, further comprising a step of heating the partition plate using a heater incorporated in the partition plate.

4. The method of claim 1, wherein the fluoride gases are selected from the group consisting of $NF_3$, $F_2$, $SF_6$, $CF_4$, $C_2F_6$ and $C_3F_8$.

5. The method of claim 3, wherein the heating of the partition plate is carried out within a temperature range which inhibits the adsorption of fluorine onto an inner circumferential face of the through-holes and the surface of the partition plate.

6. The method of claim 5, wherein the cleaning gas is carbon fluoride gas or nitrogen fluoride and the partition plate is heated to 200° C. or more.

7. The method of claim 5, wherein the cleaning gas is sulfur fluoride gas and the partition plate is heated to 100° C. or more.

8. The method according to claim 1, wherein the vacuum vessel is configured in a CVD apparatus, wherein, when feeding the active species, the second space in which a film-deposition processing is executed is cleaned by feeding the activate species generated in the plasma generating step.

9. The method according to claim 1, wherein a first surface of the partition plate facing the first space and a second surface of the partition plate facing the second space are in contact with electrically conductive members.

10. A cleaning method executed in a vacuum vessel which has a partition plate which divides an interior space of the vacuum vessel into a first space and a second space in which a substrate to be processed is arranged and has a plurality of through-holes for communicating between the first space and the second space, the method comprising:

feeding one or more types of fluoride gas and oxygen gas as cleaning gas into the first space;

a plasma generating step of generating active species by applying high-frequency electric power to electrodes arranged in the first space; and feeding the active species generated in the plasma generating step from the first space into the second space through the plurality of through-holes, wherein a peripheral portion of the partition plate is fixed to an inner wall of the vacuum vessel via an electrically conductive member which has spring properties, and the partition plate is kept at a ground potential.

11. A cleaning method executed in a vacuum vessel which has a partition plate which divides an interior space of the vacuum vessel into a first space and a second space in which a substrate to be processed is arranged and has a plurality of through-holes for communicating between the first space and the second space, the method comprising:

feeding fluoride gas as cleaning gas into the first space;

a plasma generating step of generating active species by applying high-frequency electric power to electrodes arranged in the first space; and feeding the active species generated in the plasma generating step from the first space into the second space through the plurality of through-holes, wherein a peripheral portion of the partition plate is fixed to an inner wall of the vacuum vessel via an electrically conductive member which has spring properties, and the partition plate is kept at a ground potential.

* * * * *